US006452850B1

(12) United States Patent
Frey et al.

(10) Patent No.: US 6,452,850 B1
(45) Date of Patent: Sep. 17, 2002

(54) READ AMPLIFIER SUBCIRCUIT FOR A DRAM MEMORY

(75) Inventors: Alexander Frey; Werner Weber, both of München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/799,940

(22) Filed: Mar. 6, 2001

(30) Foreign Application Priority Data

Mar. 6, 2000 (DE) .......................................... 100 10 886

(51) Int. Cl.[7] ................................................. G11C 7/00
(52) U.S. Cl. ................................... 365/205; 365/189.09
(58) Field of Search .............................. 365/205, 196, 365/207, 189.09, 190, 202

(56) References Cited

U.S. PATENT DOCUMENTS

| 5,646,900 A | 7/1997 | Tsukade et al. |
| 5,821,769 A | 10/1998 | Douseki |
| 6,265,906 B1 * | 7/2001 | Komatsu .................. 327/53 |

OTHER PUBLICATIONS

Kuge, Shigehiro et al.: "SOI–DRAM Circuit Technologies for Low Power High Speed Multigiga Scale Memories", IEEE Journal of Solid State Circuits, vol. 31, No. 4, Apr. 1996, pp. 586–591, XP 000597231.

* cited by examiner

*Primary Examiner*—David Nelms
*Assistant Examiner*—Thong Le
(74) *Attorney, Agent, or Firm*—Laurence A. Greenberg; Werner H. Stemer; Ralph E. Locher

(57) ABSTRACT

A description is given of a sense amplifier subcircuit (10), for example an N latch section or a P latch section, for a DRAM memory for amplifying voltage signals read from a bit line (50), having at least two evaluation transistors (20; 30), the gate (21) of one evaluation transistor (20) being connected or connectable to at least one bit line (50) and the gate (31) of another evaluation transistor (30) being connected or connectable to at least one reference bit line (51) and the drains (23, 33) of the evaluation transistors (20; 30) being connected or connectable to the bit lines (51, 50) and the sources (22, 32) of the evaluation transistors (20; 30) being connected or connectable to a (NCS/PCS) lead (11).

9 Claims, 2 Drawing Sheets

PRIOR ART

READ AMPLIFIER SUBCIRCUIT FOR A DRAM MEMORY

BACKGROUND OF THE INVENTION

Field of the Invention

The present invention relates to a sense amplifier and to a DRAM memory that includes the sense amplifier.

DRAM memories (Dynamic Random Access Memories) constitute an important type of memory for storing digital information. They are memories in which, after the specification of an address, data can be stored and read out again under this address. In this case, the information is stored as a quantity of charge on a capacitance. Therefore, a DRAM memory cell is constructed very simply since it can comprise merely a capacitance and a selection transistor.

DRAM memories usually have a number of DRAM memory cells which are each combined to form one or more memory cell arrays. The individual memory cells are wired to the periphery by word lines and bit lines. The bit line wiring in this case defines a grid into which read/write amplifiers are also inserted. The read/write amplifiers have the task of amplifying voltage values read from the bit lines to correspondingly predetermined levels, so that these voltage values can be evaluated and processed further in a suitable manner.

In order to read a DRAM memory cell, the latter is firstly activated via a word line. Afterwards, the memory cell can be read by the information stored in it being fed as a voltage signal via the bit line to the read/write amplifier. In order to be able to correctly evaluate the information content of the memory cell, it is furthermore necessary to compare the information read out via the bit line of the memory cell to be read, or the corresponding voltage signal, with a reference voltage signal. To that end, the read/write amplifier is furthermore connected to at least one reference bit line, which is in turn connected to a memory cell which is currently not being evaluated.

In order to be able to evaluate the voltage signals read from the memory cell to be evaluated, they must be correspondingly amplified. To that end, the read/write amplifier generally has one or more sense amplifier subcircuits. The sense amplifier subcircuit of a DRAM memory has the task of amplifying a small voltage signal, which results from the voltage level stored in the memory cell, reliably and quickly to full levels.

Depending on the information content of the memory cell to be read, the voltage level has to be amplified to a low or high level. A low level is produced by means of a sense amplifier subcircuit referred to as an N latch. A high level is produced by means of a sense amplifier subcircuit referred to as a P latch.

In the case of the "mid-level" evaluation scheme which is customary nowadays, the bit line level at the beginning of the evaluation is at half the array voltage. In this case, the array voltage corresponds to the high level. Using an example, if the low level has a value of 0 volts, for example, and the high level has a value of 2 volts, for example, this means that the bit line level at the beginning of the evaluation is at 1 volt.

The sense amplifier subcircuits usually have at least two evaluation transistors which may be designed for example, but not exclusively, as "field-effect transistors". The field-effect transistor (FET) is a semiconductor device having three terminals, which are designated by gate (G), source (S) and drain (D).

An important parameter in field-effect transistors is the "threshold voltage". This is that voltage starting from which a drain current flows in the transistor. That is to say the transistor opens. This means that, starting from the threshold voltage, the potential barrier in the transistor is reduced to such an extent that a current can flow. If a reverse voltage is applied between source and bulk, the value of the threshold voltage increases since the potential barrier increases. The bulk of the transistor is a fourth terminal, which results from the common carrier, usually a semiconductor carrier, and is also designated by substrate.

Sense amplifier subcircuits for a DRAM memory for amplifying voltage signals read from a bit line generally have at least two such evaluation transistors, the gate of one transistor being connected or connectable to at least one bit line and the gate of another evaluation transistor being connected or connectable to at least one reference bit line. Furthermore, the drains of the evaluation transistors are connected or connectable to bit lines and the sources of the evaluation transistors are connected or connectable to a lead. The lead, which is also designated as "NCS" in N latch sections or, respectively, is also designated as "PCS" in P latch sections, is a line via which the sense amplifier circuit is activated.

If, in the "mid-level" evaluation scheme, the bit line level at the beginning of the evaluation is at approximately half the array voltage, this voltage level also corresponds to the gate-source voltage across the evaluation transistors. In order to achieve the evaluation with the necessary speed, the gate-source voltage must lie above the threshold voltage of the evaluation transistors by a sufficiently high magnitude. For reasons of line density and reliability, the array voltage is scaled downward with diminishing feature sizes, that is to say with advancing DRAM generations. Since the threshold voltage of the evaluation transistors cannot be reduced to the same extent as the array voltages, the distance between the initial bit line level—for example half the array voltage, which corresponds to half the supply voltage—and the threshold voltage of the evaluation transistors becomes smaller and smaller. The evaluation transistors "open" less and less and the evaluation thus requires more and more time. It is very disadvantageous, however.

When "SOI transistors" are used, it is possible to control the substrate potential of a transistor with a low power consumption. The designation "SOI" denotes "silicon on insulator". Transistors of this type have recently acquired more and more importance. SOI transistors are already known per se from the prior art.

SOI transistors open up the possibility of using a substrate control effect to influence the threshold voltage of the evaluation transistors in a positive way for the evaluation speed. The substrate, or the bulk of the transistor, is also referred to as the body in SOI transistors.

The prior art has already disclosed a number of possible solutions to enable the threshold voltage of evaluation transistors designed as SOI transistors to be influenced by means of the substrate control effect. These solutions are illustrated in FIGS. 1 to 3 and are explained in more detail in the context of the description of the figures.

In the embodiment illustrated in FIG. 1, the voltages across the sense amplifier subcircuit of a conventional sense amplifier, said subcircuit being designed as an N latch, are shown at the beginning of the evaluation operation. There is a negative voltage between source and body, said voltage increasing the threshold voltage of the transistors on account of the substrate control influence. This is disadvantageous, however, for the reasons mentioned above.

FIG. 2 illustrates the principle of "body synchronous sensing", in which the undesirable threshold voltage increase is avoided by source and body being kept at the same potential.

FIG. 3 illustrates the circuitry of the N latch section of a sense amplifier in the case of "super body synchronous sensing". The body voltage can be set via a separate line. At the beginning of the evaluation, the body voltage is set such that the source-body voltage becomes positive and the threshold voltage of the evaluation transistors is thus reduced by means of the substrate control influence. However, a positive source-body voltage means that the source-bulk diodes are forward-biased. Therefore, the sensing scheme can only be used for voltage levels at which the resulting forward current is small enough that it does not have a disadvantageous effect. The last-mentioned solution is described for example in the paper "SOI-DRAM Circuit Technologies for Low Power High Speed Multi Giga Scale Memories" by Kuge et al., IEEE Journal of Solid-State-Circuits, Vol. 31, number 4, April 1996, pages 586 ff.

SUMMARY OF THE INVENTION

Taking the abovementioned prior art as a departure point, the present invention is based on the object of further improving a sense amplifier subcircuit for a DRAM memory and also a DRAM memory in such a way that the evaluation of the memory cells can be carried out in an acceptably short time even in the case of small array voltages.

In accordance with the first aspect of the present invention, what is provided is a sense amplifier subcircuit for a DRAM memory for amplifying voltage signals read from a bit line, having at least two evaluation transistors, the gate of one evaluation transistor being connected or connectable to at least one bit line and the gate of another evaluation transistor being connected or connectable to at least one reference bit line and the drains of the evaluation transistors being connected or connectable to the bit lines and the sources of the evaluation transistors being connected or connectable to a lead. According to the invention, the sense amplifier subcircuit is characterized in that at least one of the evaluation transistors is designed in such a way that its threshold voltage changes dynamically during the evaluation operation by virtue of the change in the gate voltage being coupled to a change in the bulk voltage.

The sense amplifier subcircuit according to the invention makes it possible to evaluate the DRAM memory cells in an acceptably short time even in the case of small array voltages.

The amplifying effect of the sense amplifier subcircuit according to the invention is illustrated below with reference to an N latch section. This effect is based firstly on the fact that the evaluation transistor with the higher gate voltage discharges a capacitance connected to its drain to 0 volts more quickly than the evaluation transistor with the lower initial gate voltage. The more quickly decreasing bit line level in turn couples to the gate of the transistor which conducts more poorly anyway, and closes said transistor further.

This amplifying effect is now increased according to the invention by the threshold voltage of the transistor which conducts better being dynamically reduced, while the threshold voltage of the transistor which conducts more poorly is dynamically increased.

This dynamic change is realized by the change in the gate voltage being coupled to a change in the bulk voltage. This means that the bulk voltage changes at the same time as the gate voltage changes. The transistor which conducts better is made to conduct even better very much more quickly, while the transistor which conducts more poorly is made to conduct even more poorly very much more quickly. As a result, the evaluation time can be considerably reduced.

One advantage of the sense amplifier subcircuit according to the invention over the "super body synchronous sensing" known from the prior art is that the sense amplifier subcircuit according to the invention manages without additional control lines, for instance for the N and P bodies of the P and N latches. The timing for driving the bodies (bulks) can thus be omitted. It is only by this means that the dynamic change in the threshold voltage of the at least one evaluation transistor is made possible, since the body voltage changes at the same time as and in direct dependence on the gate voltage.

For small array voltages, which may be about 0.6 to 0.9 volts for technology generations where F=70 nm and about 0.5 to 0.6 volts for F=50 nm, the sense amplifier subcircuit according to the invention enables accelerated evaluation in comparison with conventional sense amplifier subcircuits. In this case, F is understood to be the minimum lithographic feature size.

The dynamic change in the threshold voltage can advantageously be realized by the bulk (or the body) and the gate of the at least one evaluation transistor being connected to one another via a connection.

The source-drain diode of the at least one evaluation transistor is preferably forward-biased. As in the case of "super body synchronous sensing" the scheme according to the invention can therefore be used for those voltage levels at which the resulting forward current is small enough that it does not have a disadvantageous effect.

The sense amplifier subcircuit according to the invention can advantageously be designed as a circuit for producing the low level (N latch) and/or as a circuit for producing the high level (P latch).

The at least one evaluation transistor can advantageously be designed as an SOI transistor. Such SOI transistors are particularly suitable since a separate region forming the bulk region (body region) is required. In the case of transistors produced in a conventional manner, although it would also be possible to produce such a body region, this would require a significantly greater outlay and would thus entail significantly higher costs, so that the use of SOI transistors is preferred.

In accordance with a second aspect of the present invention, a DRAM memory is provided, having a number of DRAM memory cells which are connected via bit lines to at least one read/write amplifier, the read/write amplifier likewise being connected to at least one reference bit line, characterized in that the read/write amplifier, for amplifying voltage signals read from a bit line, has one or more sense amplifier subcircuit(s) according to the invention as described above.

This makes it possible to evaluate the individual memory cells of the DRAM memory in an acceptably short time even in the case of small array voltages.

A sense amplifier subcircuit according to the invention as described above is used particularly preferably for evaluating small array voltages of $\leq 1$ volt.

The invention will now be explained in more detail using exemplary embodiments with reference to the accompanying drawing, in which:

DESCRIPTION OF THE PREFERRED EMBODIMENTS

Figure 1:
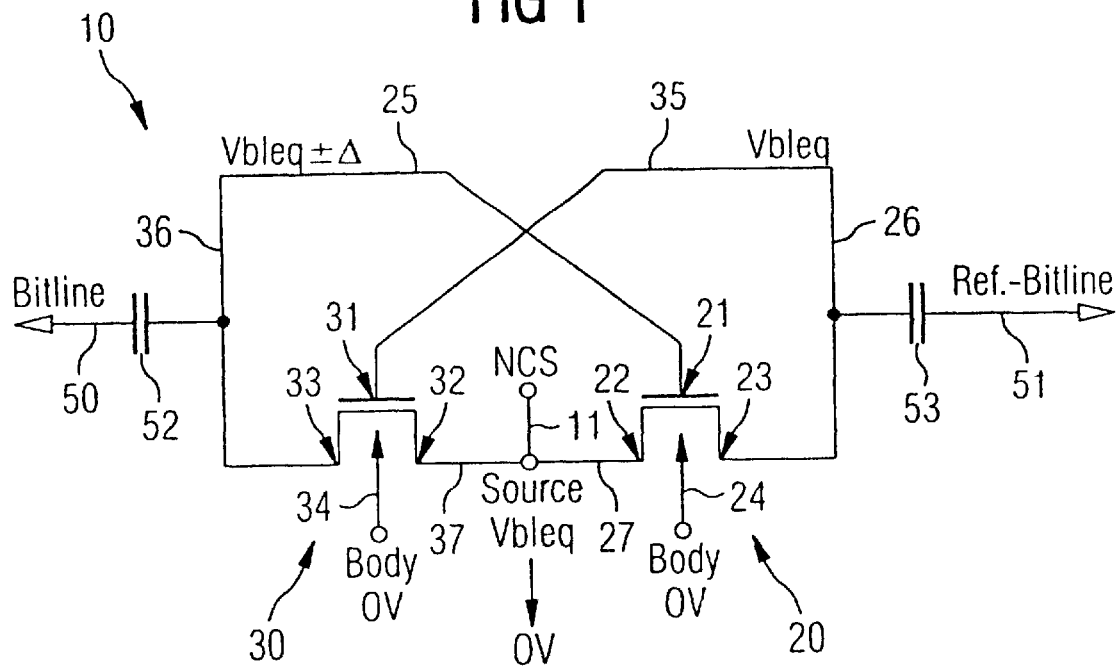
FIG. 1 shows the circuit arrangement of an N latch section of a conventional sense amplifier with the voltages present at the beginning of the evaluation operation.

FIG. 1 illustrates a sense amplifier subcircuit 10, as is known from the prior art. The sense amplifier subcircuit 10 has two evaluation transistors 20, 30, the evaluation transistors 20, 30 each having a gate 21, 31, a source 22, 32, a drain 23, 33 and also a bulk 24, 34. The evaluation transistors 20, 30 are designed as "SOI transistors", so that the bulk is also designated as the body and this designation is used in the further description of the figures.

The gate 21 of the evaluation transistor 20 is connected via a connection 25 (VBLEQ ±Δ) to a bit line (Bitline) 50. The gate 31 of the evaluation transistor 30 is connected via a connection (VBLEQ) 35 to a reference bit line (Ref. Bitline) 51.

The sources 22, 32 of the evaluation transistors 20, 30 are connected via corresponding connections 27, 37 to a lead 11, which, in the present example, is an "NCS line", via which the sense amplifier subcircuit 10, which is designed as an N latch section, is activated.

The drains 23, 33 of the evaluation transistors 20, 30 are connected via corresponding connections 26, 36 to the bit lines 50, 51 and are in contact with capacitances 52, 53.

The method of operation of this sense amplifier subcircuit 10 known from the prior art will now be described below. It is assumed that the sense amplifier subcircuit 10 is an "N latch", whose task is to amplify a voltage signal read from the bit line 50 to the low level. This low level may be 0 volts, for example. At the beginning of the evaluation operation, the bit line level on all of the bit lines, that is to say on the bit line 50 and reference bit line 51 in the exemplary embodiment, is approximately half the array voltage VBLEQ. Since the DRAM memory cell to be evaluated has an information content, the voltage signal on the bit line to be read is either increased or reduced by a specific magnitude Δ depending on the information content in the cell.

If it is assumed that the voltage value is increased by a magnitude of Δ, then this means that, after the beginning of the evaluation operation, a higher voltage is present at the gate 21 of the transistor 20 than is the case at the gate 31 of the transistor 30. On account of the higher voltage at the gate 21, the transistor 20 conducts better. As a result, the potential from the NCS lead 11 drops better and more quickly across the transistor 20. By virtue of this effect and also by virtue of the fact that the transistor 30 conducts more poorly anyway on account of the lower gate voltage, the conduction in the transistor 30 becomes poorer and poorer as the evaluation time increases, while the conduction in the transistor 20 becomes better and better.

In order, in the sense amplifier subcircuit 10 in accordance with FIG. 1, to be able to achieve evaluation with a sufficiently high speed, the gate-source voltage across the transistors 20, 30 must lie above the threshold voltage of the transistors 20, 30 by a sufficiently high magnitude. With increasing miniaturization of the DRAM memory structures, the array voltage is reduced further and further, however, for reasons of power density and reliability. However, the threshold voltage of the evaluation transistors 20, 30 cannot be reduced to the same extent as the array voltage, as a result of which the distance between these two voltages becomes smaller and smaller. The evaluation transistors 20, 30 open less and less, for which reason the evaluation requires more and more time.

In the exemplary embodiment illustrated in FIG. 1, there is the additional fact that a negative voltage is in each case present between the sources 22, 32 and the bodies 24, 34 of the evaluation transistors 20, 30, said voltage increasing the threshold voltage of the evaluation transistors 20, 30 on account of the substrate control influence.

The conventional sense amplifier subcircuit 10 illustrated in FIG. 1 is not suitable, therefore, for being able to carry out evaluations of DRAM memory cells in an acceptably short time in the case of small array voltages of ≦1 volt.

Figure 2:
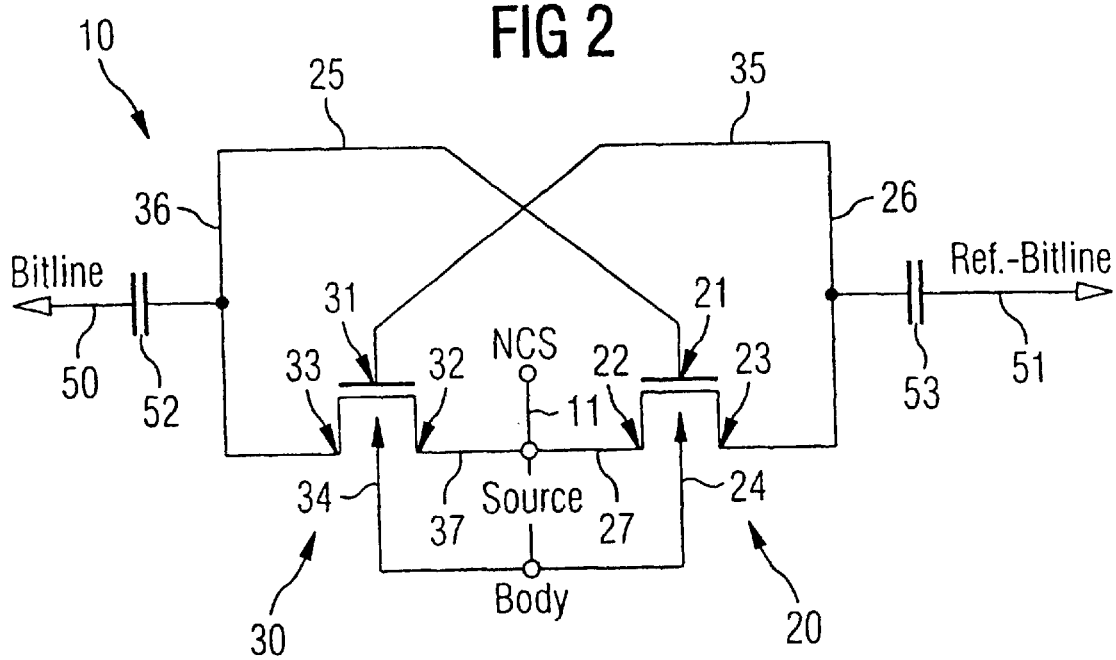
FIG. 2 shows a circuit arrangement of the N latch section of a conventional sense amplifier in the case of body synchronous sensing.

In order to be able to avoid an undesirable threshold voltage increase in the evaluation transistors 20, 30, "body synchronous sensing" was developed, this being illustrated in FIG. 2. In terms of its basic construction and in terms of its basic method of operation, the sense amplifier subcircuit 10 illustrated in FIG. 2 corresponds to the sense amplifier subcircuit 10 illustrated in FIG. 1, so that identical components are provided with identical reference numerals. Moreover, in order to avoid repetition, another description is dispensed with and reference is made to the explanations concerning the exemplary embodiment in accordance with FIG. 1.

In contrast to the embodiment in accordance with FIG. 1, in the case of the sense amplifier subcircuit 10 illustrated in FIG. 2, the undesirable threshold voltage increase in the evaluation transistors 20, 30 is avoided by the sources 22, 32 and bodies 24, 34 of the evaluation transistors 20, 30 being kept at the same potential. To that end, the sources 22, 32 and bodies 24, 34 are connected to one another and are thus at the same potential irrespective of the NCS voltage.

Figure 3:
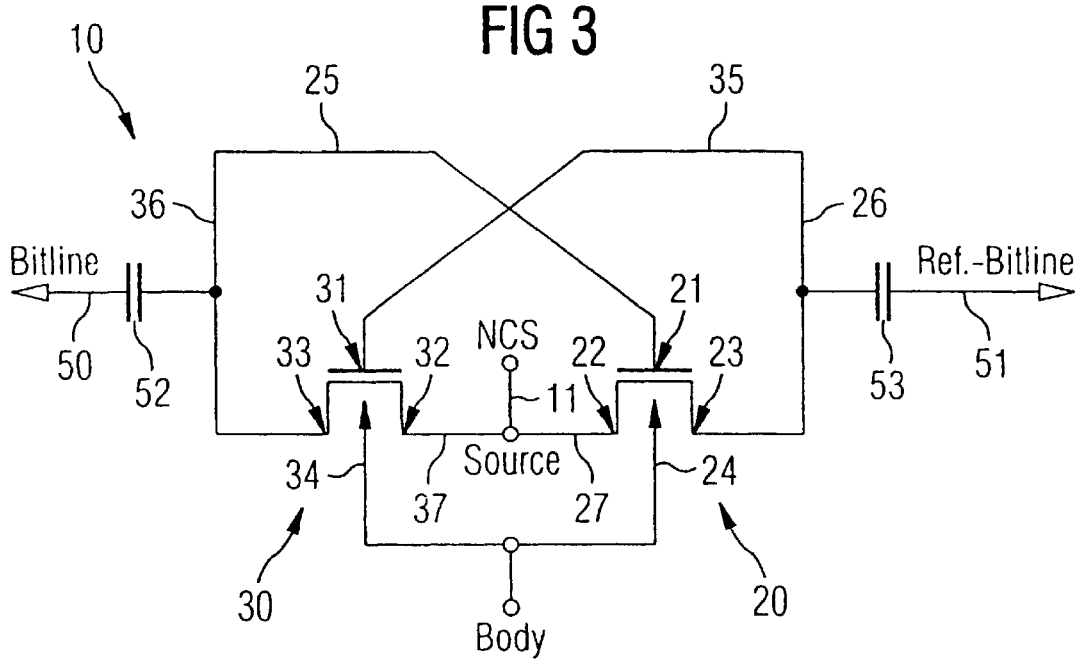
FIG. 3 shows a circuit arrangement of the N latch section of a conventional sense amplifier in the case of super body synchronous sensing.

FIG. 3 illustrates the circuitry of a sense amplifier subcircuit 10, for example the N latch section of the sense amplifier, in the case of the known super body synchronous sensing. The basic construction and the basic method of operation of the sense amplifier subcircuit 10 once again correspond to the exemplary embodiments illustrated in FIGS. 1 and 2, so that identical components are once again provided with identical reference numerals and, in order to avoid repetition, reference is made to the description concerning FIGS. 1 and 2.

In contrast to the embodiments illustrated in FIGS. 1 and 2, the bodies 24, 34 of the evaluation transistors 20, 30 can be put at a specific potential via a separate line. At the beginning of the evaluation, the body voltage is set such that the source-body voltage becomes positive. The threshold voltage of the evaluation transistors 20, 30 can thus be reduced by means of the substrate control influence. What is disadvantageous about this embodiment, however, is the fact that additional control lines are necessary in order to be able to set the body voltage. Furthermore, it is necessary to provide regulating circuits which regulate the timing for driving the bodies 24, 34.

Figure 4:
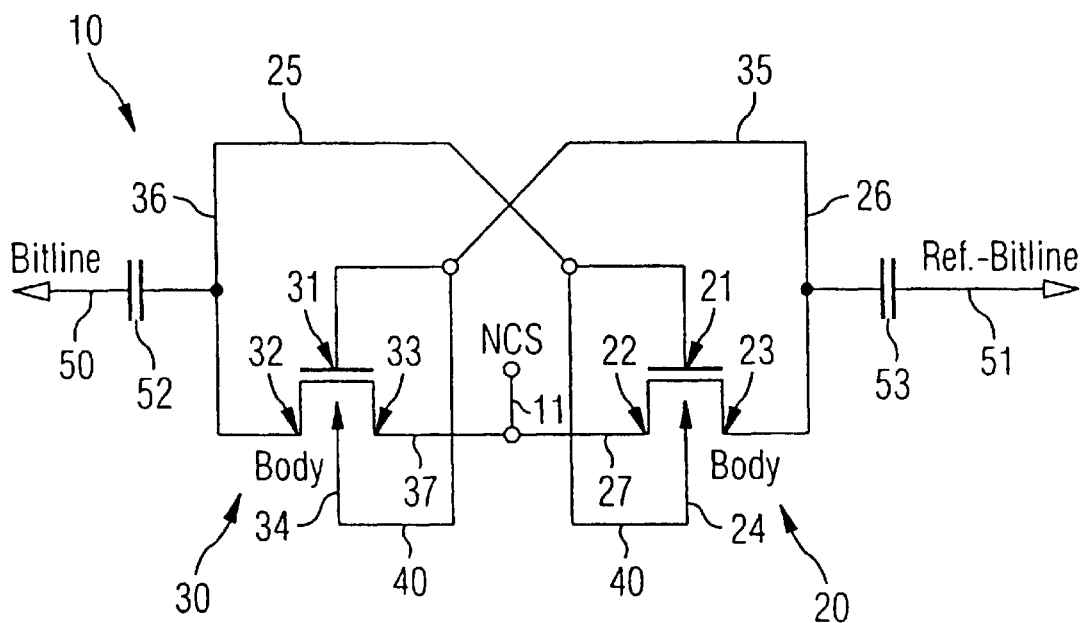
FIG. 4 shows a circuit arrangement of the N latch section of a sense amplifier subcircuit according to the invention.

In order to be able to realize, in a simple, cost-effective yet reliable manner, an acceptable evaluation of DRAM memory cells even in the case of small array voltages, the invention proposes a modified sense amplifier subcircuit 10, as is illustrated for example in FIG. 4. In FIG. 4, the principle of the sense amplifier subcircuit 10 according to the invention is shown using the N latch section. However, the sense amplifier subcircuit 10 can also analogously be designed and function as a P latch section. The basic construction and the basic method of operation of the sense amplifier subcircuit 10 once again correspond to the exemplary embodiments illustrated in FIGS. 1 to 3, so that identical components are once again provided with identical reference numerals. Likewise, reference is made to the description with regard to FIGS. 1 to 3.

According to the invention, the sense amplifier subcircuit 10 is designed in such a way that the threshold voltages of the two evaluation transistors 20, 30 change as a function of their gate voltages or of the bit line levels. To that end, the gates 21, 31 and bodies 24, 34 of the evaluation transistors 20, 30 are in each case connected to one another via a connection 40.

The amplifying effect of the sense amplifier subcircuit 10 is, then, based firstly on the fact that the evaluation transistor 20 with the higher gate voltage (in order to provide a better understanding, the conditions mentioned with regard to the example in accordance with FIG. 1 are once again assumed) discharges the capacitance 53 connected to its drain 23 to 0 volts more quickly than the evaluation transistor 30 with the lower initial gate voltage. The more rapidly decreasing bit line level in turn couples to the gate 31 of the transistor 30 which conducts more poorly anyway, and closes said transistor further.

In the case of the sense amplifier subcircuit 10 according to the invention, the amplifying effect is now increased by the threshold voltage of the transistor 20 which conducts better being dynamically reduced owing to the connection 40 between the body 24 and the gate 21, while the threshold voltage of the transistor 30 which conducts more poorly is dynamically increased.

Via the connection 40, the change in the gate voltage is coupled to the change in the body voltage, so that the evaluation transistor 20 which conducts better is made to conduct even better very much more quickly, while the evaluation transistor 30 which conducts more poorly anyway is made to conduct even more poorly very much more quickly.

We claim:

1. A sense amplifier subcircuit for a DRAM memory for amplifying voltage signals read from a bit line, comprising:
   a lead;
   at least one bit line;
   at least one reference bit line;
   at least two evaluation transistors, each one of said evaluation transistors having a gate, a drain, and a source;
   said gate of one of said evaluation transistors configured in a manner selected from the group consisting of being connected to said at least one bit line and being connectable to said at least one bit line;
   said gate of another one of said evaluation transistors being configured in a manner selected from the group consisting of being connected to said at least one reference bit line and being connectable to said at least one reference bit line;
   said drain of said one of said evaluation transistors being configured in a manner selected from the group consisting of being connected to said at least one bit line and being connectable to said at least one bit line;
   said drain of said one of said evaluation transistors being configured in a manner selected from the group consisting of being connected to said at least one bit line and being connectable to said at least one bit line;
   said source of said one of said evaluation transistors and said source of said other one of said evaluation transistors being configured in a manner selected from the group consisting of being connected to said lead and being connectable to said lead; and
   at least one of said evaluation transistors designed to have a threshold voltage that changes dynamically during an evaluation operation by virtue of a change in a gate voltage being coupled to a change in a bulk voltage.

2. The sense amplifier subcircuit according to claim 1, comprising:
   a connection;
   at least of said evaluation transistors having a bulk connected to said gate of said at least one of said evaluation transistors by said connection.

3. The sense amplifier subcircuit according to claim 2, wherein said at least one of said evaluation transistors has a source-drain diode that is forward-biased.

4. The sense amplifier subcircuit according to claim 1, wherein said at least one of said evaluation transistors has a source-drain diode that is forward-biased.

5. The sense amplifier subcircuit according to claim 1, wherein said evaluation transistors are designed as a circuit for producing a low level.

6. The sense amplifier subcircuit according to claim 1, wherein said evaluation transistors are designed as a circuit for producing a high level.

7. The sense amplifier subcircuit according to claim 1, wherein at least one of said evaluation transistors is designed as an SOI transistor.

8. A DRAM memory, comprising:
   at least one reference bit line;
   at least one read/write amplifier for amplifying voltage signals read from one of said plurality of said bit lines, said read/write amplifier connected to said at least one reference bit line; and
   a plurality of DRAM memory cells that are connected to said at least one read/write amplifier by said plurality of said bit lines;
   said read/write amplifier having a sense amplifier subcircuit including:
   a lead;
   at least one bit line;
   at least one reference bit line; and
   at least two evaluation transistors, each one of said evaluation transistors having a gate, a drain, and a source;
   said gate of one of said evaluation transistors configured in a manner selected from the group consisting of being connected to said at least one bit line and being connectable to said at least one bit line;
   said gate of another one of said evaluation transistors being configured in a manner selected from the group consisting of being connected to said at least one reference bit line and being connectable to said at least one reference bit line;
   said drain of said one of said evaluation transistors being configured in a manner selected from the group consisting of being connected to said at least one reference bit line and being connectable to said at least one reference bit line;
   said drain of said other one of said evaluation transistors being configured in a manner selected from the group consisting of being connected to said at least one bit line and being connectable to said at least one bit line;

said source of said one of said evaluation transistors and said source of said other one of said evaluation transistors being configured in a manner selected from the group consisting of being connected to said lead and being connectable to said lead; and at least one of said evaluation transistors designed to have a threshold voltage that changes dynamically during an evaluation operation by virtue of a change in a gate voltage being coupled to a change in a bulk voltage.

9. A method for using a sense amplifier subcircuit, which comprises:

providing a sense amplifier subcircuit including:

a lead;

at least one bit line;

at least one reference bit line; and at least two evaluation transistors, each one of the evaluation transistors having a gate, a drain, and a source;

the gate of one of the evaluation transistors configured in a manner selected from the group consisting of being connected to the at least one bit line and being connectable to the at least one bit line;

the gate of another one of the evaluation transistors being configured in a manner selected from the group consisting of being connected to the at least one reference bit line and being connectable to the at least one reference bit line;

the drain of the one of the evaluation transistors being configured in a manner selected from the group consisting of being connected to the at least one reference bit line and being connectable to the at least one reference bit line;

the drain of the other one of the evaluation transistors being configured in a manner selected from the group consisting of being connected to the at least one bit line and being connectable to the at least one bit line;

the source of the one of the evaluation transistors and the source of the other one of the evaluation transistors being configured in a manner selected from the group consisting of being connected to the lead and being connectable to the lead; and at least one of the evaluation transistors designed to have a threshold voltage that changes dynamically during an evaluation operation by virtues of a change in a gate voltage being coupled to a change in a bulk voltage; and using the sense amplifier subcircuit for evaluating small array voltages of $\leq 1$ volt.

* * * * *